United States Patent [19]

Ichimura et al.

[11] Patent Number: 4,925,770
[45] Date of Patent: May 15, 1990

[54] CONTRAST-ENHANCING AGENT FOR PHOTOLITHOGRAPHY

[75] Inventors: Kunihiro Ichimura, Tsukuba; Teruhiko Yonezawa, Kanagawa; Hideo Kikuchi, Chiba; Nariaki Tochizawa; Keiichi Hayashi, both of Funabashi, all of Japan

[73] Assignees: Director General of Agency of Industrial Science and Technology, Tokyo; Toyo Gosei Kogyo Co., Ltd., Chiba, both of Japan

[21] Appl. No.: 284,251

[22] Filed: Dec. 14, 1988

Related U.S. Application Data

[63] Continuation-in-part of Ser. No. 47,187, May 6, 1987, abandoned.

[30] Foreign Application Priority Data

May 20, 1986 [JP] Japan ............................. 61-113508
Jun. 16, 1986 [JP] Japan ............................. 61-138144

[51] Int. Cl.$^5$ ............................................. G03C 1/733
[52] U.S. Cl. ................................... 430/273; 430/339; 430/311
[58] Field of Search ............... 430/339, 311, 292, 273, 430/512, 580

[56] References Cited

U.S. PATENT DOCUMENTS 3,104,973  8/1960  Sprague et al. .................... 430/339
3,826,656  7/1974  Jenkins et al. ..................... 430/339
4,677,049  6/1987  Griffing et al. .................... 430/339
4,702,996  10/1987 Griffing et al. .................... 430/325
4,745,042  5/1988  Sasago et al. ...................... 430/156
4,804,614  2/1989  Halle ................................ 430/311
4,816,380  3/1989  Covington et al. ................. 430/311

Primary Examiner—Paul R. Michl
Assistant Examiner—Mark R. Buscher
Attorney, Agent, or Firm—Hopgood, Calimafde, Kalil, Blaustein & Judlowe

[57] ABSTRACT

The invention provides a novel contrast-enhancing agent for photolithography which is used as an overcoating on a positive-working photoresist layer for enhancing the contrast of the photoresist in a low-contrast exposure to light. The composition comprises, in addition to a watersoluble polymer, e.g., poly(vinyl alcohol), poly(vinyl pyrroilidone) and pullulan, as the binder, a specific photo-bleachable organic compound having, in a molecule, at least one nitrogen-containing heterocyclic aromatic structure represented by the general formula

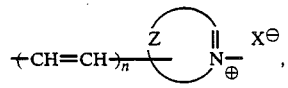

in which Z is a divalent group to form the heterocyclic aromatic ring with the nitrogen atom, X is an anionic group of monovalency and n is a positive integer of, e.g., 1 or 2.

7 Claims, No Drawings

CONTRAST-ENHANCING AGENT FOR PHOTOLITHOGRAPHY

BACKGROUND OF THE INVENTION

This is a continuation-in-part application from a copending U.S. patent application Ser. No. 47,187 filed May 6, 1987, now abandoned.

The present invention relates to a contrast-enhancing agent for photolithography or, more particularly, to a composition used in photolithography for forming a patterned image of a photoresist layer by the light-projection method with an object to enhance the contrast of the image by providing a thin layer of a photo-bleachable composition on the photoresist layer so as to give a possibility of forming a patterned image of extreme fineness to exceed the highest fineness attainable in the prior art.

It is an effective method known in the prior art that, as a method for enhancing the contrast of an image on a photoresist layer having a threshold value of contrast when the image is formed by light-projection through a photomask having lower contrast than the threshold value of contrast, the photoresist layer is overlaid with a thin layer containing a photo-bleachable compound. The photo-bleachable compound here implied is a compound of which the intensity of light absorption can be decreased by exposure to light in a wavelength region from ultraviolet to visible used for exposure (see, for example, Journal of Imaging Science, volume 30, No. 2, pages 65–68, March/April, 1986, by P. R. West, et al. and a preprint in Regional Technical Conference on "Photopolymers: Principles and Materials", November, 1982, by B. F. Griffing, et al.).

A particular method disclosed in Japanese Patent Kokai 59-104642 is to provide the photoresist layer thereon with a thin layer of a contrast-enhancing agent comprising a polymeric binder and a photo-bleachable compound of which the ratio of the molar-extinction coefficient given in liter/g·cm to the molecular weight is approximately 10 or larger in the unbleached condition and the ratio of the molar extinction coefficient in the unbleached condition to that in the bleached condition is approximately 10 or larger.

In this prior art method, the contrast-enhancing agent is prepared by dissolving an aryl nitron compound as a photo-bleachable compound and a polymeric binder in an organic solvent which may be an aliphatic or aromatic hydrocarbon solvent, halogenated aliphatic hydrocarbon solvent or alcohol. When such an organic solution is applied to the surface of the photoresist layer to form a contrast-enhancing layer, it is more or less unavoidable that the surface of the photoresist layer is attacked and at least partially dissolved by the organic solvent in the solution to cause intermixing of the contrast-enhancing agent and the photoresist composition at the interface of the layers so that the quality of the patterned image is greatly affected. In addition, the contrast-enhancing agent is hardly soluble in the developer solution of the photoresist layer so that the procedure of development must be preceded by dissolving and removing the contrast-enhancing layer with an organic solvent and the process of development is necessarily complicated and troublesome.

In order to provide a solution for the above mentioned problems in respect of the development procedure, improved contrast-enhancing agents have recently been disclosed by use of which the contrast-enhancing layer can be removed and the photoresist layer can be developed in one step. Some of such improved compositions include those disclosed in "Denshi Zairyou" (Electronic Materials), volume 46, No. 7 (1985) and in the lecture presented at the Allied Lectures related to Applied Physics, Japan, 1985, spring session, comprising a diazo compound as the photo-bleachable compound and pullulan as the binder and those disclosed in Nikkei New Materials, January 13 Issue, page 29 (1986) in which pullulan and poly(vinyl pyrrolidone) are used in combination as the binder.

These contrast-enhancing agents, however, are defective in respect of the long-term storage stability as a consequence of the formulation comprising a reactive diazo compound as the photo-bleachable compound.

SUMMARY OF THE INVENTION

An object of the present invention is therefore to provide a novel contrast-enhancing agent free from the above described problems and disadvantages in the conventional contrast-enhancing agents of prior art, which is characteristically advantageous in respect of the long-term storage stability as well as in respect of the solubility behavior that the photoresist layer is safe from the attack of the agent when the contrast-enhancing layer is formed thereon and that the development of the photoresist layer can be carried out without being preceded by the step of dissolving away the contrast-enhancing layer.

The contrast-enhancing agent provided by the present invention comprises, in admixture:

(a) a photo-bleachable compound having, in a molecule, at least one characteristic structural unit represented by the general formula

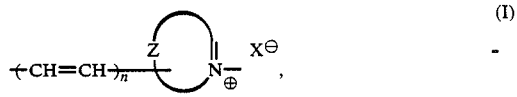

in which Z is a divalent group to form a heterocyclic aromatic ring structure together with the nitrogen atom, X is an anionic group of monovalency and n is a positive integer; and (b) a water-soluble polymer selected from the class consisting of polyvinyl alcohol, polyvinyl pyrrolidone and pullulan.

The photo-bleachable compound as the component (a) is preferably a compound represented by the general formula

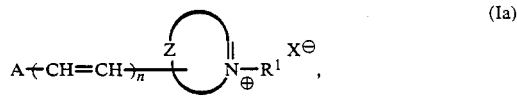

in which A is an aromatic group selected from the class consisting of an unsubstituted or substituted phenyl group of the general formula

unsubstituted or substituted α- or β- naphthyl group of the general formula

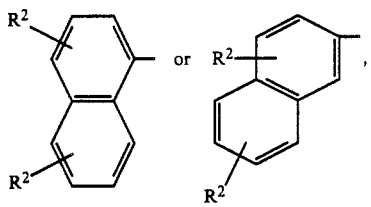

9-anthranyl group, unsubstituted or substituted furyl group of the general formula

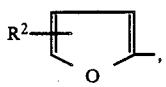

unsubstituted or substituted benzofuryl group of the general formula

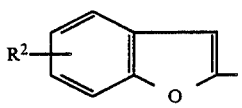

and unsubstituted or substituted thienyl group of the general formula

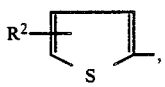

the subscript n is 1, 2 or 3 or, preferably, 1 or 2, Z is a divalent residue of group selected from the class consisting of pyridyl, quinolyl and benzothiazolyl groups forming a nitrogen-containing aromatic heterocyclic ring, which is preferably a pyridyl or quinolyl group, together with the nitrogen atom, X is an anionic group of monovalency and $R^1$ is a hydrogen atom or a group selected from the class consisting of alkyl, alkenyl and aralkyl groups, $R^2$ being an atom of hydrogen or a halogen or a group selected from the class consisting of alkyl, hydroxy, alkoxy, formyl and acyl groups.

The water-soluble polymer as the component (b) to serve as a binder should be contained in an amount in the range from 0.5 to 10 parts by weight per part by weight of the photo-bleachable compound as the component (a).

DETAILED DESCRIPTION OF THE PREFERRED EMBODIMENTS

Figure 1:
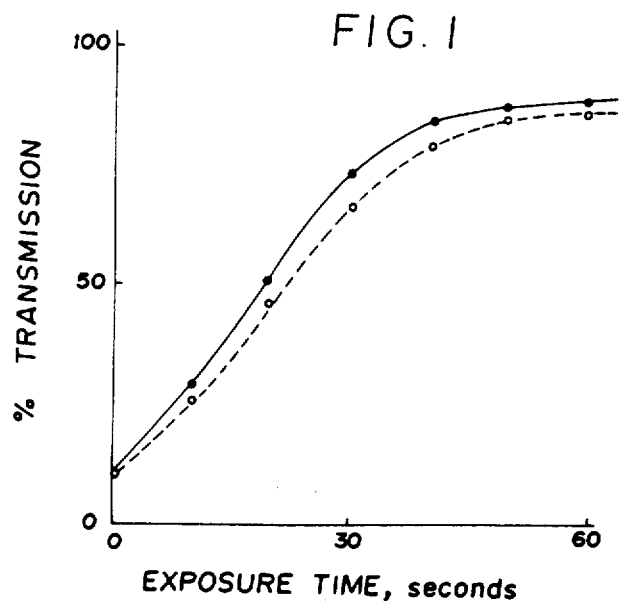
FIGS. 1, 2 and 3 are each a graphic showing of the photo-bleaching characteristics of the contrast-enhancing agents prepared in Examples 1 and 2, in Examples 3 and 4, and in Examples 5 and 6, respectively.

As is understood from the above given summary of the invention, the essential components in the inventive contrast-enhancing agent is the specific photo-bleachable compound having, in a molecule, at least one nitrogen-containing heterocyclic structural unit of the general formula (I) as the component (a) and a water-soluble polymeric binder as the component (b). The photo-bleachable compound as the component (a) is preferably a compound represented by the general formula (Ia) given above. In this general formula (Ia), the group denoted by A is a substituted or unsubstituted aromatic group which is exemplified by phenyl, naphthyl, furyl, anthranyl, thienyl and benzofuryl groups as the examples of the unsubstituted aromatic groups. When the group denoted by A is a substituted aromatic group, the substituent can be selected from the class consisting of those atoms and groups capable of substituting on the aromatic nucleus including halogen atoms as well as hydroxy, alkyl, alkoxy, formyl and acyl groups.

The heterocyclic aromatic structure of the formula

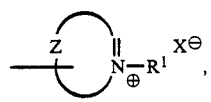

in the characteristic structural unit of the general formula (Ia) without the portion of $A+CH=CH)_{\overline{n}}$ can be derived from one of the compounds represented by the following general formulas:

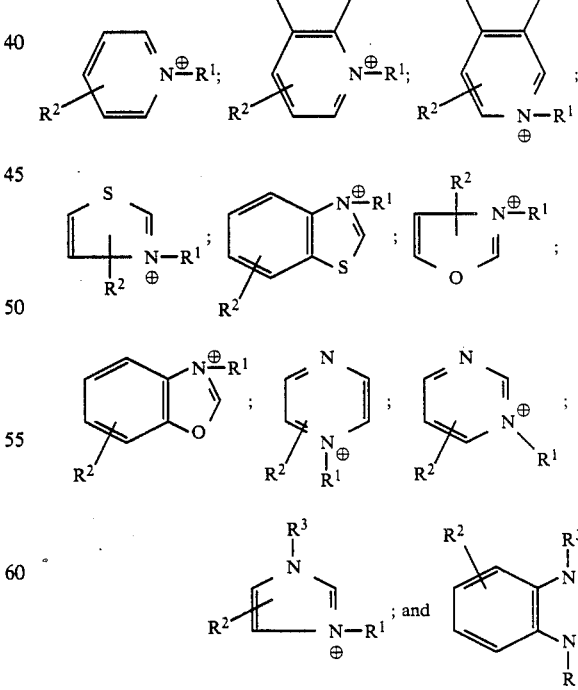

In these formulas, the symbols $R^1$ and $R^2$ each have the same meaning as defined above and the symbol $R^3$ in the formulas may have the same meaning as $R^1$.

Further, the symbol X in the general formula (I) or (Ia) denotes an anionic group of monovalency such as ions of halogen, sulfate, alkyl sulfate, phosphate, sulfonate and the like.

It is optional that two kinds or more of these photo-bleachable compounds are used in the inventive contrast-enhancing agent in combination.

The subscript n in the general formula (I) or (Ia) is a positive integer and, although the value of n has no particular upper limit, it is preferable that n has a value of 1, 2 or 3 or, more preferably, 1 or 2 so that preferable photo-bleachable compounds are represented by the following general formula (II) or (III):

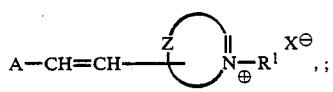

and

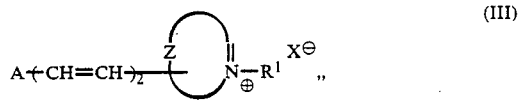

in which the symbols A, Z, $R^1$ and X each have the same meaning as defined above.

Particular examples of the photo-bleachable compounds in conformity with the general formula (II) include the compounds expressed by the following structural formulas (II-1) to (II-53) and those in conformity with the general formula (III) include the compounds expressed by the following structural formulas (III-1) to (III-4):

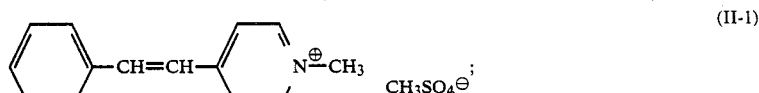

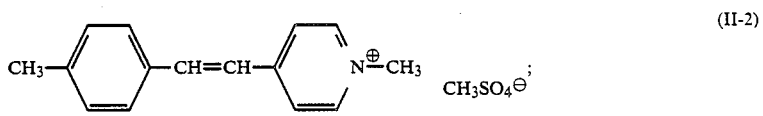

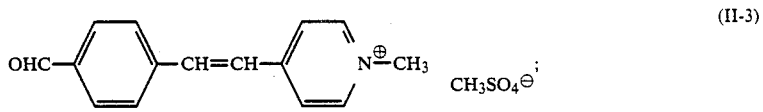

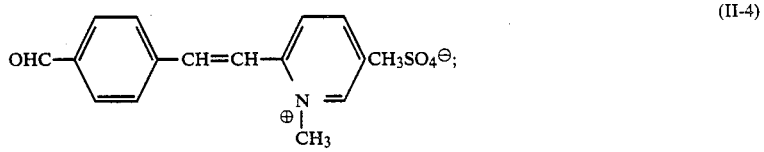

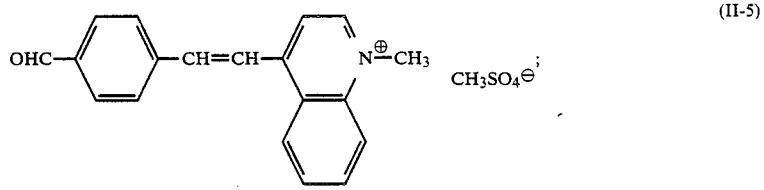

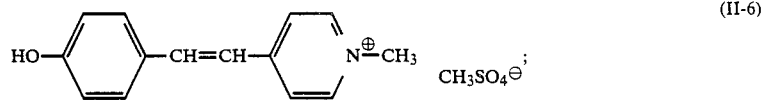

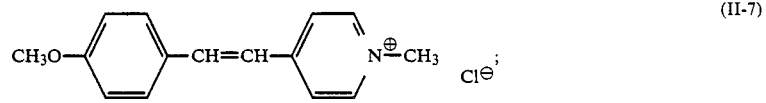

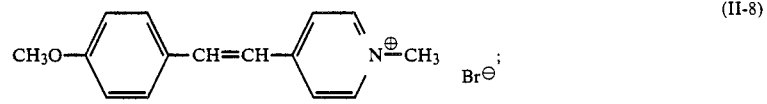

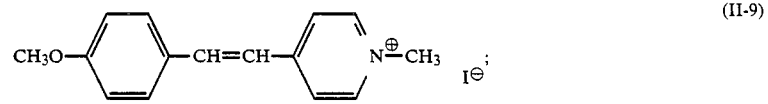

-continued
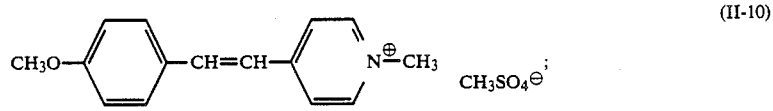 (II-10)
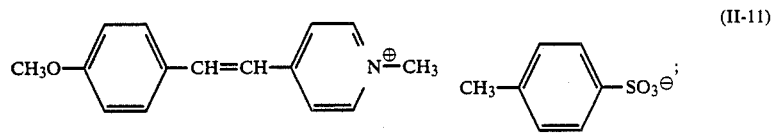 (II-11)
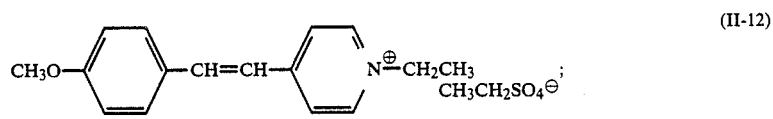 (II-12)
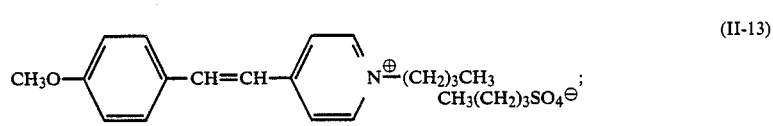 (II-13)
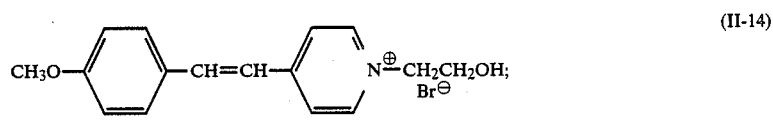 (II-14)
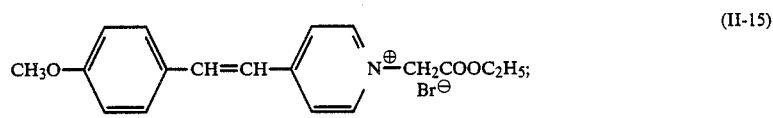 (II-15)
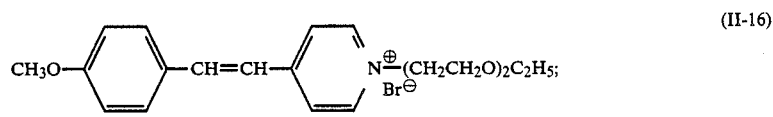 (II-16)
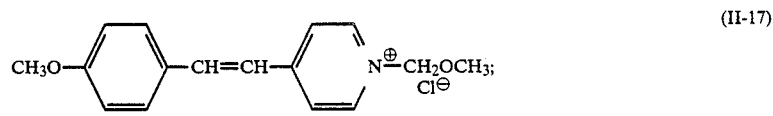 (II-17)
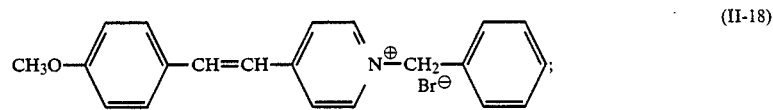 (II-18)
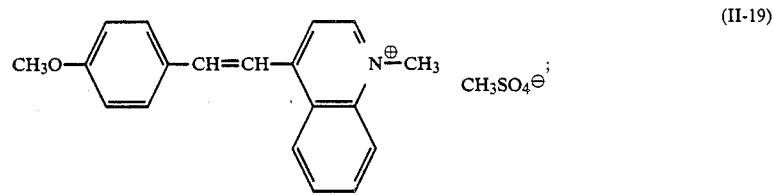 (II-19)
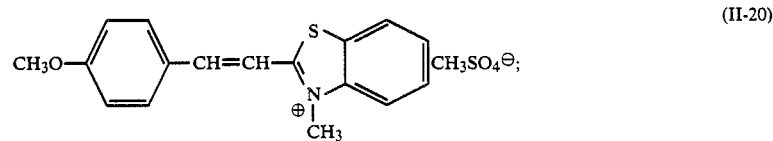 (II-20)

-continued
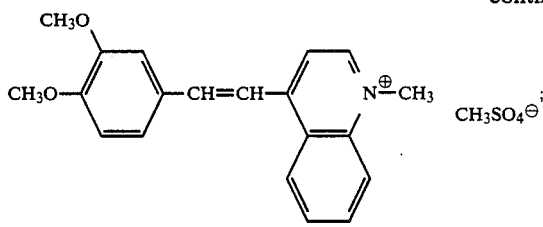 (II-21)
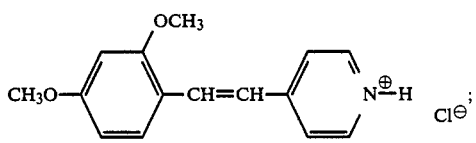 (II-22)
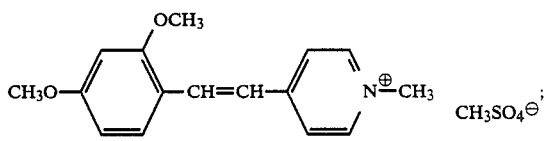 (II-23)
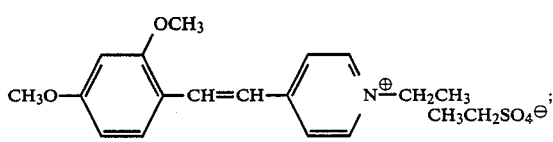 (II-24)
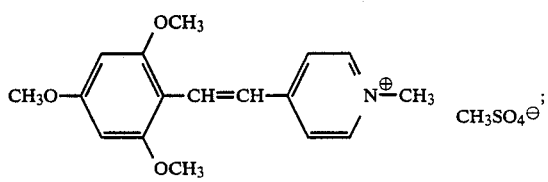 (II-25)
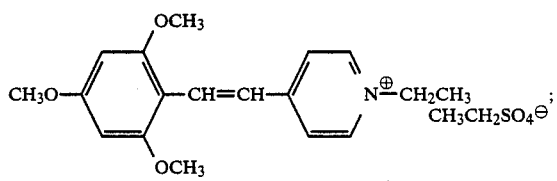 (II-26)
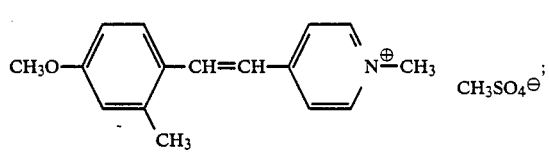 (II-27)
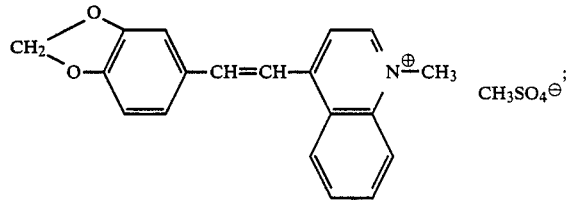 (II-28)
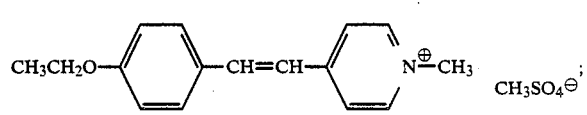 (II-29)
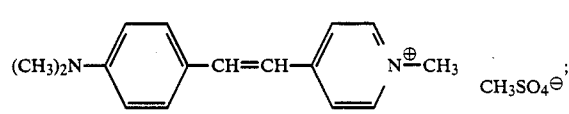 (II-30)

-continued
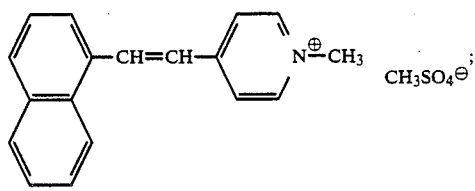 (II-31)
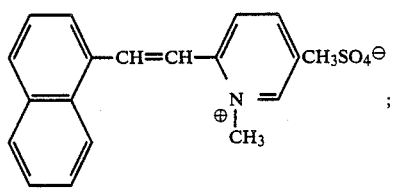 (II-32)
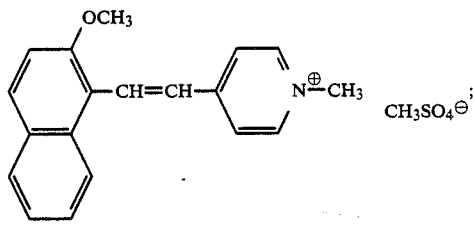 (II-33)
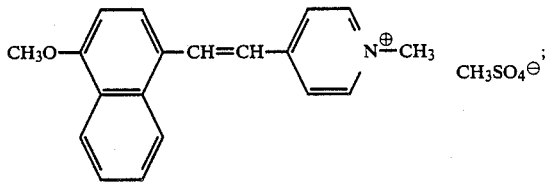 (II-34)
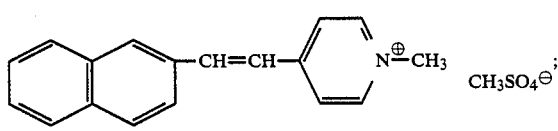 (II-35)
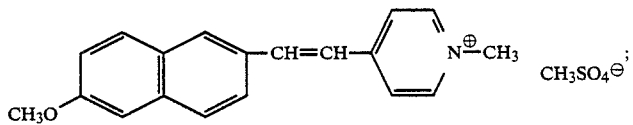 (II-36)
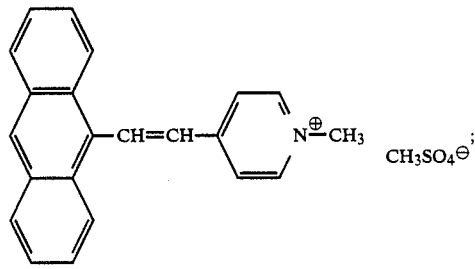 (II-37)
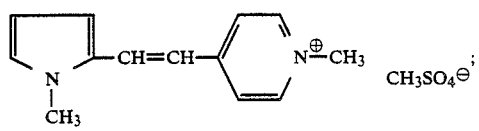 (II-38)
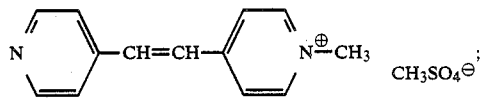 (II-39)

-continued
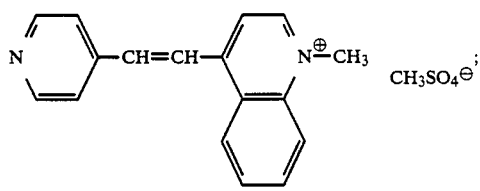 (II-40)
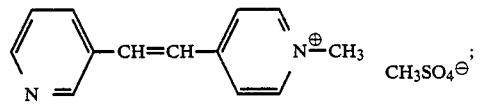 (II-41)
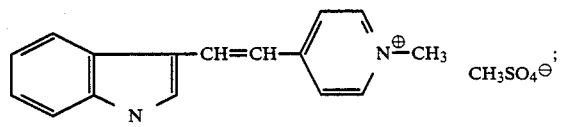 (II-42)
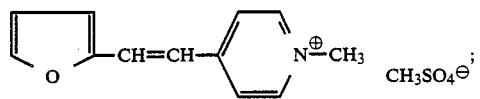 (II-43)
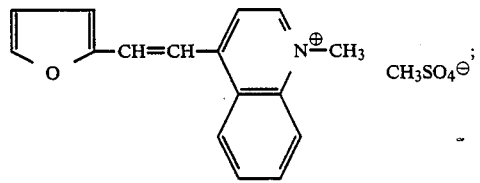 (II-44)
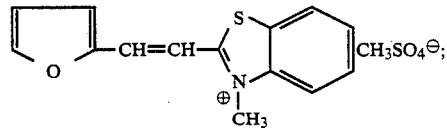 (II-45)
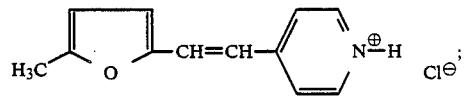 (II-46)
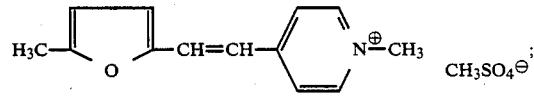 (II-47)
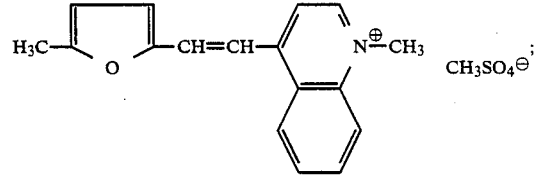 (II-48)
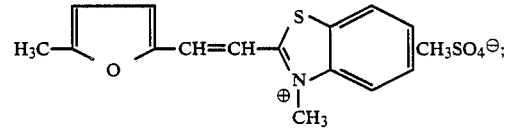 (II-49)
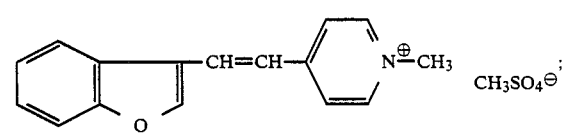 (II-50)

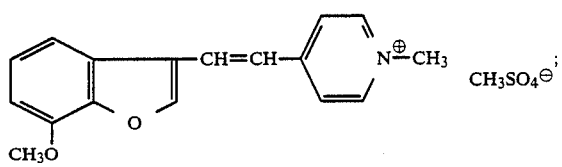 (II-51)
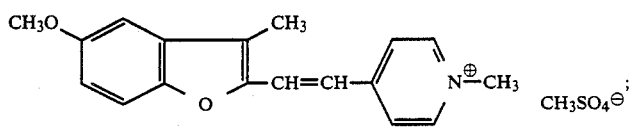 (II-52)
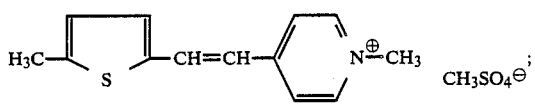 (II-53)
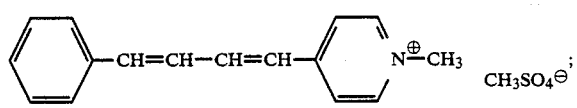 (III-1)
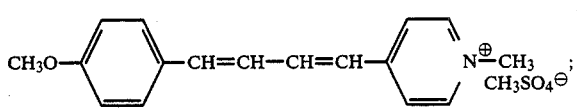 (III-2)
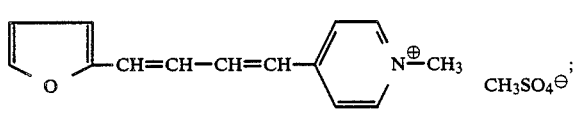 (III-3)
and
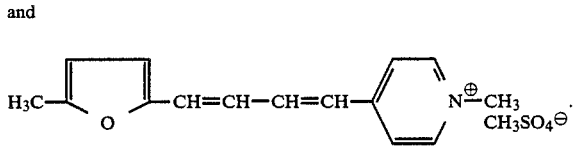 (III-4)
Among the compounds expressed by the above given structural formulas, preferable are the compounds represented by either one of the following general formulas (A) to (H), in which each of the symbols R' is methyl, ethyl or propyl group independently from the others:
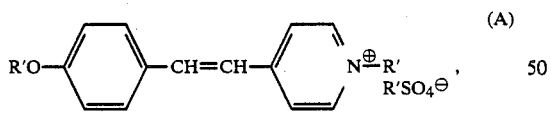 (A)
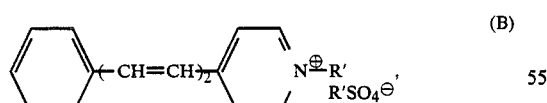 (B)
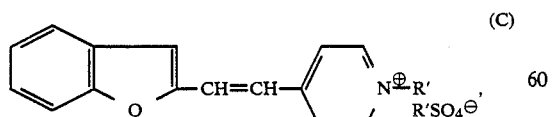 (C)
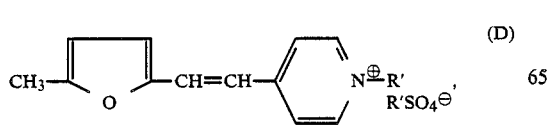 (D)
-continued
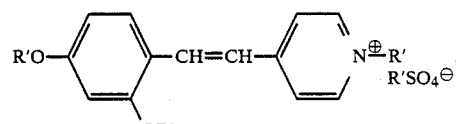 (E)
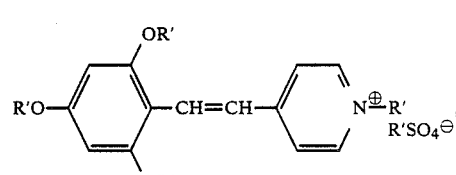 (F)
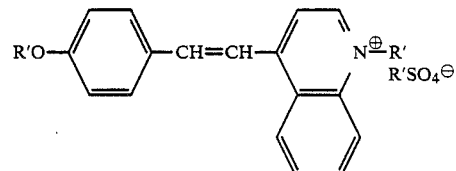 (G)
and

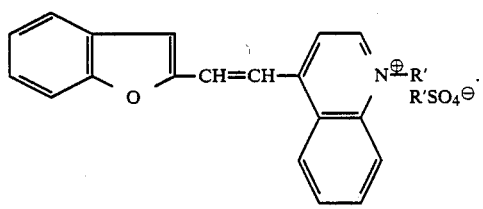

(H)

An example of the photo-bleachable compound of the general formula (Ia) in which the subscript n is 3 is the compound expressed by the following structural formula (IV-1):

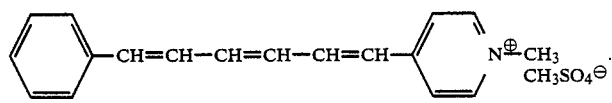

The photo-bleachable compound represented by the general formula (Ia) can be synthesized by various known methods, of which a preferable synthetic route, though not particularly limited thereto, is as follows. Thus, a heterocyclic nitrogen-containing aromatic compound having a methyl group bonded to the aromatic ring and a quaternary salt-forming compound of the formula $R^1$-X, in which $R^1$ and X each have the same meaning as defined above, are reacted in a suitable organic solvent such as an alcohol, e.g. methyl alcohol, isopropyl alcohol and ethylene glycol monomethyl ether, dimethylformamide, dimethylacetamide and the like to form a quaternary salt of the heterocyclic compound which is then reacted with an aromatic aldehyde compound of the formula $A(CH=CH)_n CHO$, in which A has the same meaning as defined above and n is zero or a positive integer, in a suitable solvent, which may be the same one as used in the preceding step, to give the compound represented by the general formula (Ia) in the presence of a catalyst.

An alternative synthetic route is to first perform the reaction between the heterocyclic nitrogen-containing aromatic compound having a methyl group bonded to the aromatic ring and the aromatic aldehyde compound of the formula $A(CH=CH)_n CHO$ and the product of this first-step reaction is then reacted with the quaternary salt-forming compound of the formula $R^1$—X.

Examples of the aromatic aldehyde compound of the formula $A(CH=CH)_n CHO$ used as one of the reactants in the above mentioned reactions include: benzaldehyde; 4-tolylaldehyde; terephthalaldehyde; 4-hydroxybenzaldehyde; 4-methoxybenzaldehyde, i.e. p-anisaldehyde; 4-chlorobenzaldehyde; 3,4-dimethoxybenzaldehyde, i.e. veratralaldehyde; 2,4-dimethoxybenzaldehyde; 2,4,6-trimethoxybenzaldehyde; 2-methyl-4-methoxybenzaldehyde; 3-methoxy-4-(2'-dimethoxy) benzaldehyde; 3,4-dioxymethylene benzaldehyde; 4-ethoxybenzaldehyde; 4-dimethylaminobenzaldehyde; α-naphthaldehyde; 2-methoxy-1-naphthaldehyde; 4-methoxy-1-naphthaldehyde; β-naphthaldehyde; 6-methoxy-2-naphthaldehyde; 9-anthranylaldehyde; N-methylpyrrol-2-aldehyde; 4-pyridylaldehyde; 3-pyridylaldehyde; 3-indolylaldehyde; furfural; 5-methylfurfural; 2-benzofuryl-aldehyde; 7-methoxy-2-benzofurylaldehyde; 3-methyl-5-methoxy-2-benzofurylaldehyde; 2-thienylaldehyde; 5-methyl-2-thienyl-aldehyde; cinnamaldehyde; 4-methoxycinnamaldehyde; 3-(2-furyl)acryl aldehyde; 3-(5-methyl-2-furyl)acryl aldehyde; 4-phenylbutadiene-1-aldehyde and the like.

The heterocyclic nitrogen-containing aromatic compound having a methyl group bonded to the aromatic ring used in the reactions is exemplified by α- and γ-picolines, 2-methylquinoline, 4-methylquinoline, 2-methylbenzothiazole and the like. The quaternary salt-forming compound of the formula $R^1$-X is exemplified by dimethyl sulfate, diethyl sulfate, dipropyl sulfate, dibutyl sulfate, methyl halides, methyl p-toluenesulfonate, 2-hydroxyethyl halides, ethyl halogenoacetates, 2-halogenoethyl 2'-ethoxyethyl ethers, methoxymethyl halides, benzyl halides, hydrogen halides and the like. The halogen in the above named halogenated compounds may be chlorine, bromine or iodine.

The above described compounds represented by the general formula (Ia) or (II) and (III) are very effective as a photo-bleachable compound with a very large ratio of the molar extinction coefficient in the unbleached condition to the molecular weight and a large ratio of the molar extinction coefficient before bleaching to that after bleaching. Therefore, the contrast-enhancing agent of the invention comprising such a compound is useful for imparting a greatly enhanced contrast to the patterned image formed on a photoresist layer by the projection of light when the contrast of the projected image is lower than the threshold value of contrast of the photoresist as a result of the increase in the space frequency of the image.

To give a more detailed explanation, the resolving power R in the image formation of a photoresist by the light-projection method is given by the following equation $$R = k \cdot \lambda / NA, \tag{1}$$

in which $\lambda$ is the wavelength of the exposing radiation, NA is the numerical aperture of the lens and k is a proportional constant, and the depth of focus is given by the following equation $$\Delta = \pm 1/2 \cdot \lambda / (NA)^2. \tag{2}$$

Accordingly, the resolving power R can be improved by increasing the numerical aperture of the lens NA or to have a smaller value of k assuming that the wavelength $\lambda$ is the same. When NA is increased, the depth of focus $\Delta$ is decreased as is shown by the equation (2). Therefore, the contrast-enhancing layer on a photoresist is required to have a relatively small thickness in consideration of the decreased depth of focus. This situation leads to a requirement that the concentration of the photo-bleachable compound in the contrast-enhancing layer is as high as possible in order to obtain a sufficient contrast-enhancing effect even when the thickness of the layer is very small. In this regard, the compounds represented by the general formulas (II) and (III) are preferred in view of the high miscibility thereof with the water-soluble polymer as the binder. In other words, these compounds can be dissolved in the water-soluble polymer in a relatively high concentration and a polymer film without haziness or cloudiness can be obtained from such a mixture. Following table shows the maximum amount of the compounds in g capable of being dissolved in g of a polyvinyl alcohol to form a transparent polymeric film. Structural formulas V-5, VI-1, VII-1 and IX-1 appearing in the following tabulation will be shown later.

| Formula of the compound | Amount of the compound, g |
|---|---|
| II-10 | 2.0 |
| II-26 | 1.6 |
| II-47 | 2.4 |
| II-50 | 1.3 |
| III-1 | 1.6 |
| IV-I | 0.4 |
| V-5 | 0.5 |
| V-8 | 0.6 |
| VI-1 | 0.3 |
| VII-1 | 0.5 |
| IX-1 | 0.3 |

Further, selection of the photo-bleachable compound should be made by taking into consideration the photo-bleachability behavior of the compound. The photo-bleachability BR, %, can be expressed, for example, by the following equation $$BR, \% = (D\cdot - D)/D\cdot \times 100,$$

in which $D\cdot$ is the optical density of the contrast-enhancing layer before exposure to light and D is the optical density of the contrast-enhancing layer after exposure to light, the dose of exposure light being 100 mJ/cm$^2$ and 300 mJ/cm$^2$ for the i-line light and g-line light, respectively. The results of determination of the photo-bleachability $BR_i$ and $BR_g$ obtained with the i-line light and g-line light, respectively, were as shown below.

| Formula of compound | $BR_i$, % |
|---|---|
| II-10 | 90.0 |
| II-12 | 88.3 |
| II-40 | 25.7 |
| II-50 | 93.8 |
| III-1 | 90.2 |

| Formula of compound | $BR_g$, % |
|---|---|
| II-19 | 86.3 |
| II-26 | 84.2 |
| II-30 | 8.5 |
| II-34 | 79.0 |
| II-38 | 32.8 |
| II-42 | 11.1 |
| II-45 | 48.9 |
| II-47 | 80.4 |
| III-3 | 83.8 |

The above described photo-bleachable compounds each have absorption of light in a different wavelength region from the others so that the compound should be properly selected depending on the kind of the light source, which may emit the g-line, h-line i-line, used in the exposure of the photoresist to light. The compounds of II-40, II-30, II-38, II-42 and II-45 are less preferable in the present invention in respect of the low photo-bleachability as tabulated above. Table 1 below shows the wavelength of maximum absorption, molar extinction coefficient at the wave-length and the ratio of the molar extinction coefficient given in liter/cm.mole to the molecular weight for each of the photo-bleachable compounds expressed by the structural formulas (II-1) to (II-53), (III-1) to (III-4) and (IV-1) given above.

TABLE 1

| Compound No. | $\lambda_{max}$, nm | Molar extinction coefficient $\epsilon$, liter/cm · mole | Ratio of $\epsilon$ to molecular weight |
|---|---|---|---|
| II-1 | 342 | 34,100 | 110 |
| II-2 | 354 | 35,200 | 113 |
| II-3 | 343 | 45,800 | 137 |
| II-4 | 328 | 37,100 | 111 |
| II-5 | 376 | 29,600 | 77 |
| II-6 | 374 | 34,000 | 105 |
| II-7 | 373 | 26,900 | 103 |
| II-8 | 373 | 29,000 | 95 |
| II-9 | 372 | 30,800 | 87 |
| II-10 | 373 | 34,600 | 103 |
| II-11 | 385 | 35,400 | 92 |
| II-12 | 379 | 36,500 | 100 |
| II-13 | 373 | 33,900 | 80 |
| II-14 | 373 | 28,300 | 84 |
| II-15 | 373 | 33,300 | 88 |
| II-16 | 372 | 40,000 | 98 |
| II-17 | 375 | 31,100 | 107 |
| II-18 | 373 | 36,200 | 95 |
| II-19 | 412 | 29,700 | 77 |
| II-20 | 402 | 38,000 | 105 |
| II-21 | 419 | 27,700 | 67 |
| II-22 | 387 | 28,000 | 101 |
| II-23 | 393 | 30,900 | 84 |
| II-24 | 393 | 29,500 | 75 |
| II-25 | 402 | 33,400 | 84 |
| II-26 | 402 | 34,300 | 81 |
| II-27 | 394 | 26,600 | 69 |
| II-28 | 422 | 26,900 | 67 |
| II-29 | 373 | 34,300 | 98 |
| II-30 | 448 | 25,700 | 73 |
| II-31 | 376 | 20,600 | 58 |
| II-32 | 364 | 15,200 | 42 |
| II-33 | 404 | 17,200 | 44 |
| II-34 | 409 | 25,000 | 65 |
| II-35 | 353 | 31,900 | 89 |
| II-36 | 388 | 31,700 | 82 |
| II-37 | 430 | 10,100 | 25 |
| II-38 | 425 | 32,400 | 104 |
| II-39 | 314 | 34,200 | 111 |
| II-40 | 333 | 19,900 | 55 |
| II-41 | 325 | 31,900 | 103 |
| II-42 | 418 | 34,900 | 101 |
| II-43 | 378 | 31,600 | 106 |
| II-44 | 417 | 30,800 | 88 |
| II-45 | 404 | 40,000 | 113 |
| II-46 | 392 | 39,400 | 178 |
| II-47 | 398 | 34,100 | 109 |
| II-48 | 443 | 30,700 | 84 |
| II-49 | 428 | 41,500 | 113 |
| II-50 | 388 | 38,700 | 114 |
| II-51 | 394 | 32,600 | 87 |
| II-52 | 407 | 40,900 | 105 |
| II-53 | 393 | 33,400 | 102 |
| III-1 | 377 | 45,800 | 137 |
| III-2 | 402 | 39,300 | 108 |
| III-3 | 406 | 37,300 | 115 |
| III-4 | 425 | 37,000 | 110 |
| IV-1 | 406 | 43,300 | 120 |

While each of the above described photo-bleachable compounds has only one of the structural unit represented by the general formula (I) in a molecule, the photo-bleachable compounds belonging to another preferable class each should have two structural units of the general formula (I). Such compounds can be classified into several classes depending on the manner by which the two structural units of the general formula (I) are linked together in a molecule. The compounds belonging to each class are represented by one of the following general formulas (V), (VI), (VII), (VIII) and (IX):

same symbols, they can be the same ones or may be different each from the other.

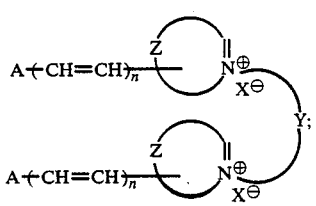
(V)

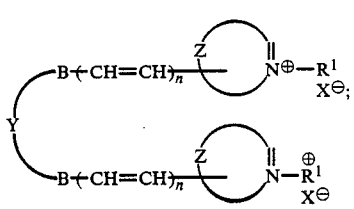
(VI)

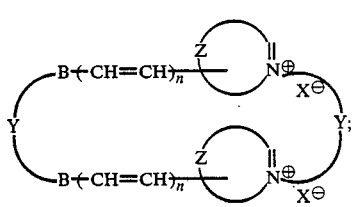
(VII)

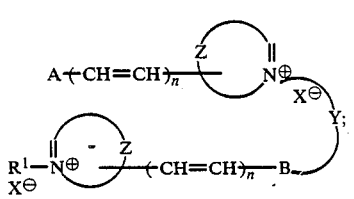
(VIII)

and

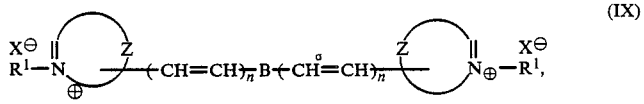
(IX)

in which A, Z, $R^1$, X and n each have the same meaning as defined for the general formula (Ia), Y is a divalent organic group, B is a substituted or unsubstituted divalent aromatic group and, when a formula has two of the same symbols, they can be the same ones or may be different each from the other.

Examples of the particular compounds represented by the above given general formulas (V) to (IX) include those expressed by the following structural formulas (V-1) to (V-11), (VI-1) to (VI-3), (VII-1), (VIII-1) and (VIII-2) and (IX-1) and (IX-2):

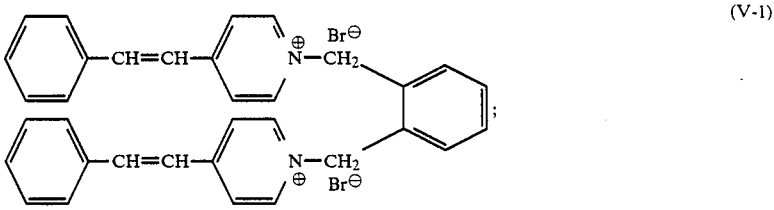
(V-1)

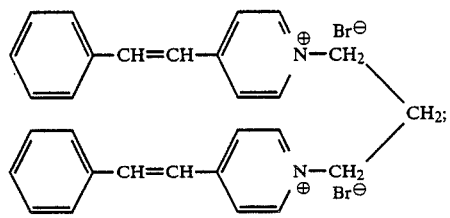
(V-2)
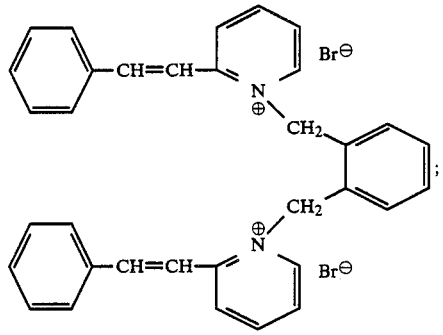
(V-3)
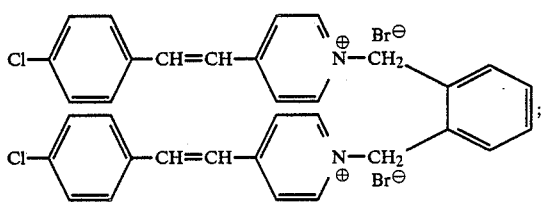
(V-4)
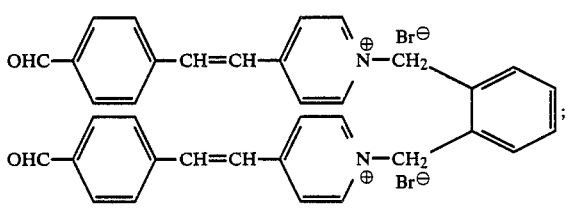
(V-5)
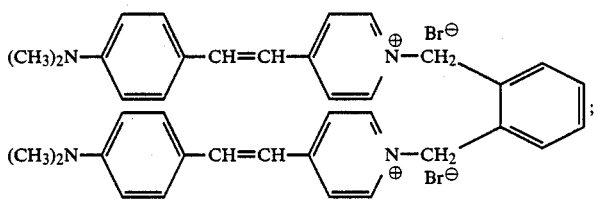
(V-6)
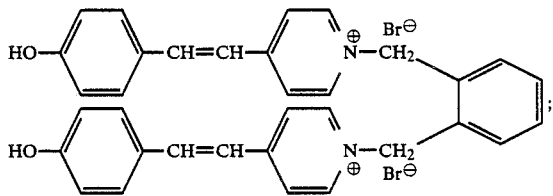
(V-7)
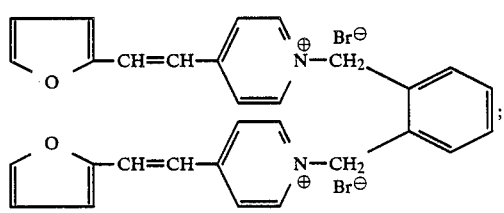
(V-8)

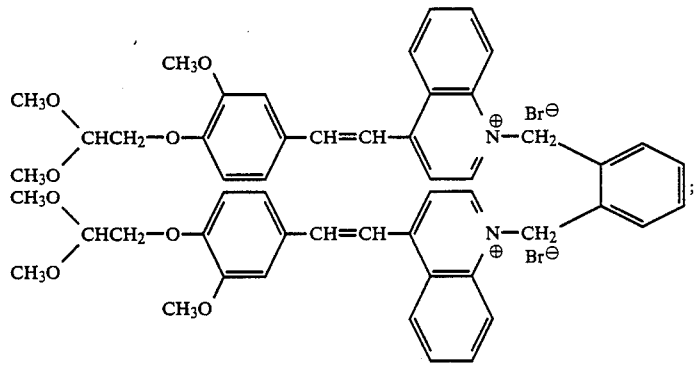
(V-9)
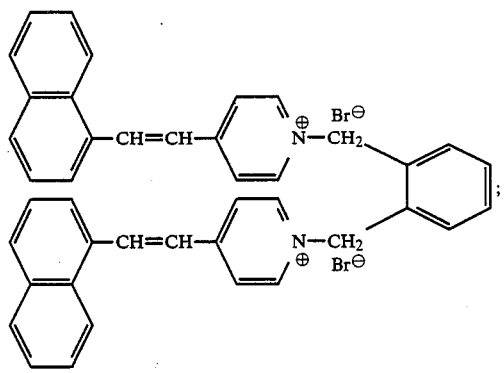
(V-10)
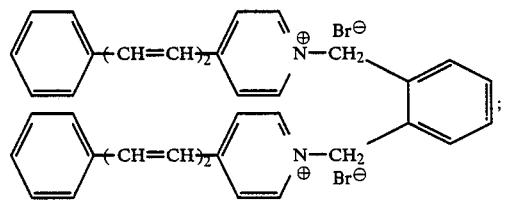
(V-11)
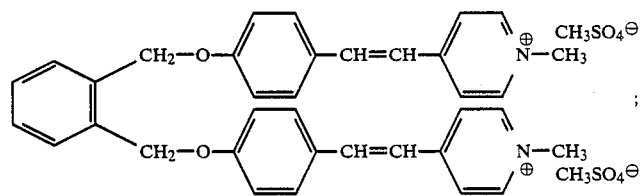
(VI-1)
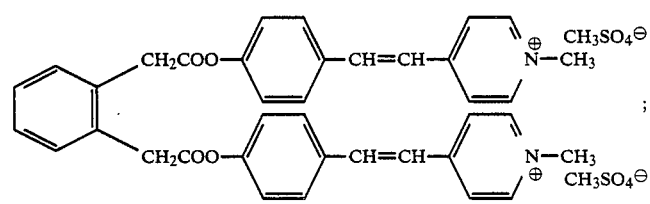
(VI-2)

-continued

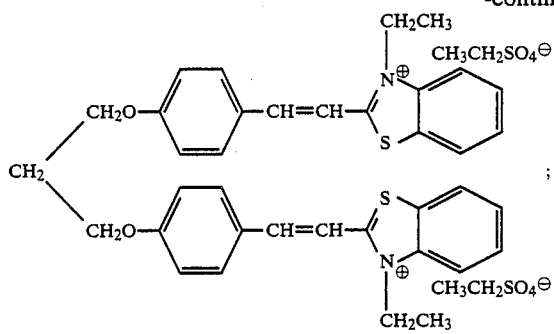 (VI-3)

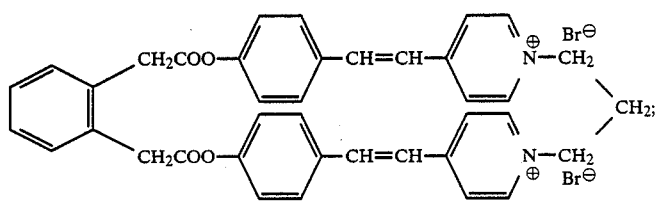 (VII-1)

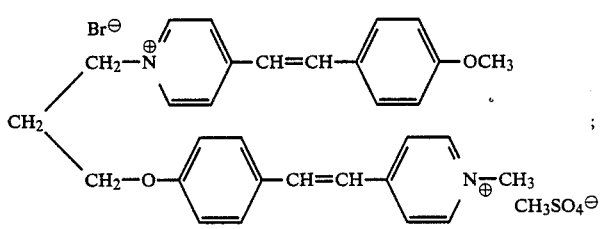 (VIII-1)

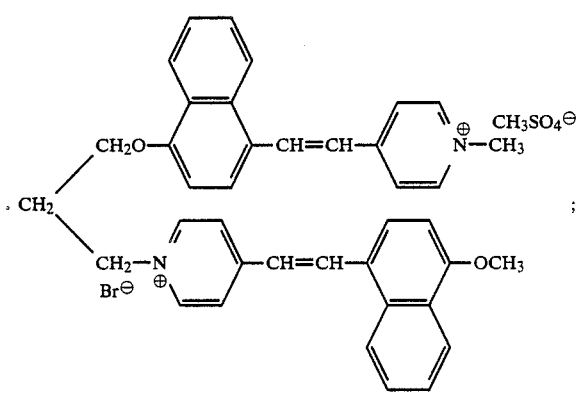 (VIII-2)

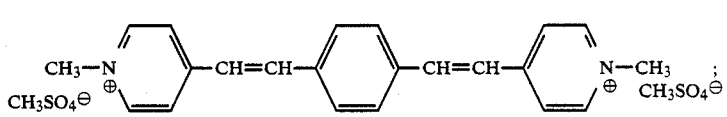 (IX-1)

and

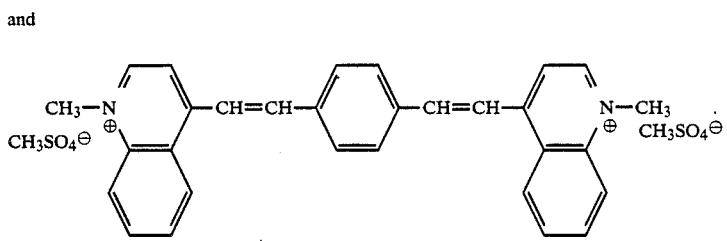 (IX-2)

The compounds represented by the general formula (V) given above can be synthesized, for example, by the following synthetic route. Thus, a nitrogen-containing heterocyclic aromatic compound having a methyl group bonded to the aromatic nucleus is first reacted with a quaternary salt-forming compound of the formula X-Y-X, in which each symbol has the same meaning as defined above, in a suitable solvent such as an alcohol, e.g. methyl alcohol, isopropyl alcohol and ethylene glycol monoethyl ether, dimethylformamide, dimethylacetamide and the like to form a quaternary salt of the heterocyclic compound in which two molecules thereof are bonded together through the group Y as a linking unit, which is then reacted with an aromatic aldehyde compound of the general formula A(CH=CH)$_n$CHO defined before in a suitable organic solvent in the presence of a catalyst.

The compounds represented by the general formula (VI) given above can be synthesized, for example, by the following synthetic route. Thus, a nitrogen-containing heterocyclic aromatic compound having a methyl group bonded to the aromatic nucleus is first reacted with an aromatic aldehyde compound and the reaction product is then reacted (1) with a difunctional organic compound which can be derived into the group denoted by Y after reaction followed by conversion of the reaction product into a quaternary salt by the reaction with a quaternary salt-forming compound of the formula R$^1$X, in which each symbol has the same meaning as defined above, or, alternatively, (2) with the quaternary salt-forming compound R$^1$X to be converted into a quaternary salt which is then reacted with the difunctional organic compound capable of being derived into the group denoted by Y after reaction.

The compounds represented by the general formula (VI) given above can be synthesized, for example, in the same synthetic route as in the preparation of the compounds represented by the general formula (VI) excepting replacement of the quaternary salt-forming compound R$^1$X with a compound represented by the general formula X-Y-X, in which each symbol has the same meaning as defined above.

The compounds represented by the general formula (VIII) or, in particular, the compound expressed by the formula (VIII-1) can be prepared in the following manner. Thus, an alkali metal salt of 4-hydroxybenzaldehyde is reacted in a suitable organic solvent, e.g. an alcohol, dimethylformamide and dimethylacetamide, with 1,3-dibromopropane to form a monoether compound which is then reacted in an organic solvent such as dimethylformamide with stilbazole obtained from 4-methoxybenzaldehyde and γ-picoline followed by the reaction with a quaternary salt of γ-picoline obtained from γ-picoline and dimethyl sulfate.

The compounds represented by the general formula (IX) can be synthesized, for example, in the following manner. Thus, the nitrogen-containing heterocyclic aromatic compound having a methyl group bonded to the aromatic nucleus is first reacted in a suitable organic solvent, which may be the same one as in the preparation of the compound of the general formula (V), with the quaternary salt-forming compound of the formula R$^1$X to form a quaternary salt thereof which is then reacted with an aromatic dialdehyde compound of the general formula OHC(CH=CH)$_n$B(CH=CH)$_n$CHO in the presence of a catalyst.

The aromatic aldehyde compound used in the above described reaction may be the same one as in the preparation of the compounds represented by the general formula (Ia). The nitrogen-containing heterocyclic aromatic compound having a methyl group bonded to the aromatic nucleus also may be the same one as used in the preparation of the compounds represented by the general formula (Ia). The quaternary salt-forming compounds include, in addition to those given as the examples of the quaternary salt-forming compound used in the preparation of the compound of the general formula (Ia), 1,4-xylylene dihalides, 1,3-dihalogenopropanes and the like.

The difunctional organic compound which can be derived into the group denoted by Y after reaction is selected, preferably, from the class consisting of 1,2-xylylene dichloride and dibromide, benzene-1,2-diacetic acid dichloride and dibromide, 1,3-dichloro- and 1,3-dibromopropanes and the like.

Table 2 below gives the wavelength of the maximum absorption, the molar extinction coefficient at the wavelength and the ratio of the molar extinction coefficient given in liter/cm. mole to the molecular weight of each of the compounds expressed by the formulas (V-1) to (V-11), (VI-1) to (VI-3), (VII-1), (VIII-1), (VIII-2), (IX-1) and (IX-2).

TABLE 2

| Compound No. | $\lambda_{max}$, nm | Molar extinction coefficient ε, liter/cm · mole | Ratio of ε to molecular weight |
|---|---|---|---|
| V-1 | 346 | 69,500 | 111 |
| V-2 | 348 | 68,900 | 119 |
| V-3 | 342 | 44,400 | 71 |
| V-4 | 354 | 76,800 | 110 |
| V-5 | 343 | 93,400 | 137 |
| V-6 | 447 | 51,500 | 73 |
| V-7 | 383 | 67,600 | 103 |
| V-8 | 379 | 58,400 | 96 |
| V-9 | 416 | 54,600 | 56 |
| V-10 | 400 | 35,000 | 49 |
| V-11 | 384 | 61,900 | 91 |
| VI-1 | 372 | 67,100 | 90 |
| VI-2 | 339 | 70,600 | 88 |
| VI-3 | 394 | 82,600 | 97 |
| VII-1 | 345 | 71,000 | 98 |
| VIII-1 | 363 | 61,000 | 93 |
| VIII-2 | 400 | 47,000 | 69 |
| IX-1 | 393 | 71,000 | 132 |
| IX-2 | 430 | 58,900 | 93 |

As is understood from Table 2, these compounds have different absorption characteristics each from the others so that proper selection of the photo-bleachable compound is essential in the formulation of the inventive contrast-enhancing agent depending on the spectral characteristic of the light used for exposure of the photoresist layer to light. For example, quite satisfactory results can be obtained by using the photo-bleachable compounds of the formulas (V-6), (V-9), (V-10), (VI-3), (VIII-2), (IX-1) and (IX-2) for a light source emitting g-lines, (V-7), (V-8), (V-9), (V-10), (V-11), (VI-2) and (IX-1) for a light source emitting h-lines and (V-1), (V-2), (V-3), (V-4), (V-5), (V-7), (V-8), (V-11), (VI-1), (VI-2), (VII-1) and (VIII-1) for a light source emitting i-lines.

The photo-bleachable compounds represented by the above given general formulas (II), (III) and (V) through (IX) are advantageously very stable and free from decomposition or structural changes when they are kept as such over a long period of time and never pertain to any reaction with other ingredients in the inventive contrast-enhancing agent. Different from conventional diazo-based contrast-enhancing agents, therefore, the inventive contrast-enhancing agent has a long storable life without denaturation even after storage for several years when it is stored in a dark place.

In addition to the above mentioned stability characteristics, the photo-bleachable compounds used in the inventive contrast-enhancing agent are characteristically soluble in water or a mixture of water and one or more kinds of organic solvents incapable of dissolving the photoresist layer. Accordingly, overcoating of the photoresist layer with the inventive contrast-enhancing agent can be performed without the danger that the underlying photoresist layer is dissolved by the coating solution to cause intermixing of the photoresist composition with the overcoating composition.

When the contrast-enhancing layer is formed of the inventive contrast-enhancing agent comprising the above described photo-bleachable compound and a water-soluble polymeric binder described below, furthermore, the layer can be dissolved away in the development treatment of the underlying photoresist layer simultaneously by using an aqueous developer solution so that the development treatment need not be preceded by the removing treatment of the overcoating layer of the contrast-enhancing agent. It is optional that development of the underlying photoresist layer is undertaken after the contrast-enhancing layer has been removed by washing with water subsequent to exposure to light. These advantages can never be obtained by using conventional nitron-based contrast-enhancing agents.

Besides the above described photo-bleachable compound as the component (a), the other essential ingredient in the inventive contrast-enhancing agent is a water-soluble polymeric material as the component (b) to serve as a binder. The polymer used for this purpose is required to have good solubility in water, high transparency to the i-line light, h-line light and g-line light at wavelengths of 365 nm, 405 nm and 436 nm, respectively, good miscibility with the above described specific photo-bleachable compound and good film-formability on the photoresist layer. Various kinds of synthetic and natural water-soluble polymers can be used for the purpose including synthetic and semi-synthetic ones such as poly(vinyl alcohol), partially saponified poly(vinyl acetate), poly(ethylene oxide), poly(acrylic acid), poly(methacrylic acid), polyacrylamide, polymethacrylamide, poly(hydroxyethyl methacrylate), poly(vinylbenzene sulfonic acid), poly(vinyl pyrrolidone), poly(vinyl pyridine), polyethyleneimine, water-soluble cellulose derivatives and the like and natural ones such as pullulan, gelatin, alginic acid, guar gum, gum arabic, tragacanth gum, casein, tamarind pulp, starch and the like, among which poly(vinyl alcohol), poly(vinyl pyrrolidone) and pullulan are particularly preferred because these polymers well satisfy the above mentioned requirements.

The contrast-enhancing agent of the invention is prepared by dissolving the photo-bleachable compound as the component (a) and the water-soluble polymeric material as the component (b) in a solvent which is usually water although a small amount of a water-miscible organic solvent such as alcohols, ketones, esters, ethers and the like may be added according to need. Furthermore, it is optional, if desired, that the inventive contrast-enhancing agent in the form of an aqueous solution may be admixed with various kinds of known additives such as surface active agents and defoaming agents with an object to improve spreadability, film-formability and other properties.

In the following, the contrast-enhancing agent of the present invention is described in more detail by way of examples as preceded by the description of the synthetic procedures for the preparation of the photo-bleachable compounds.

PREPARATION 1

The photo-bleachable compound expressed by the structural formula (II-10) was prepared in the following manner. Thus, 6.985 g (0.075 mole) of γ-picoline were dissolved in 20 ml of methyl alcohol and 9.460 g (0.075 mole) of dimethyl sulfate were added dropwise into the solution kept at a temperature of 40° C. or below under agitation. After completion of the dropwise addition of the dimethyl sulfate, the mixture was further agitated for additional 1 hour to complete the reaction for the conversion of γ-picoline into the form of quaternary salt. The reaction mixture was then admixed with 12.254 g (0.09 mole) of p-anisaldehyde and 1.277 g (0.011 mole) of piperidine followed by heating under reflux for 3 hours. After cooling to room temperature, 20 ml of acetone were added to the reaction mixture so that a crystalline material was precipiteted therein. The reaction mixture was filtrated to give 20.5 g of the precipitates which could be identified to be the compound expressed by the formula (II-10). The yield of this product was 81% of the theoretical value.

The above described synthetic procedure was applicable in substantially the same manner excepting replacement of the reactant compounds to the preparation of each of the photo-bleachable compounds expressed by the formulas (II-1), (II-2), (II-3), (II-4), (II-23), (II-24), (II-25), (II-26), (II-27), (II-29), (II-30), (II-31), (II-32), (II-33), (II-34), (II-35), (II-36), (II-37), (II-38), (II-39), (II-40), (II-41), (II-42), (II-43), (II-47), (II-50), (II-51), (II-52), (II-53), (III-1), (III-2), (III-3), (III-4) and (IV-1).

PREPARATION 2

The photo-bleachable compound expressed by the strutural formula (II-44) was prepared in the following manner. Thus, 6.782 g (0.025 mole) of 1,4-dimethylquinoline methosulfate obtained from 4-methylquinoline and dimethyl sulfate and 3.603 g (0.0375 mole) of furfural were dissolved in a solvent mixture of 28 ml of isopropyl alcohol and 7 ml of methyl alcohol and the solution was then admixed with 2.26 g of an anion-exchange resin (Amberlite IRA-45, a product by Rohm & Haas Co.) and heated under reflux for 4 hours to effect the reaction. After the end of the above mentioned reaction time, the reaction mixture still at the hot condition was filtered to remove the ion exchange resin and the filtrate was cooled so that precipitates were formed therein. Filtration of the reaction mixture gave 5.14 g of a product which could be identified to be the compound expressed by the formula (II-44). The yield of this product was 59% of the theoretical value.

The above described synthetic procedure was applicable in substantially the same manner excepting replacement of the reactant compounds to the preparation of each of the photo-bleachable compounds expressed by the formulas (II-19), (II-20), (II-21), (II-28), (II-45), (II-48) and (II-49).

PREPARATION 3

The photo-bleachable compound expressed by the structural formula (II-7) was prepared in the following manner. Thus, 4.0 g of the compound expressed by the formula (II-10) were dissolved in 50 ml of water and then 25 ml of concentrated hydrochloric acid were added thereto so that a crystalline material was precipitated in the mixture. The reaction mixture was filtered and the collected precipitates were washed with acetone followed by drying to give 2.6 g of a product which could be identified to be the compound expressed by the formula (II-7). The yield of this product was 84% of the theoretical value.

The photo-bleachable compound expressed by the structural formula (II-8) was prepared in substantially the same manner as above excepting replacement of the reactant compound.

PREPARATION 4

The photo-bleachable compound expressed by the structural formula (II-14) was prepared in the following manner. Thus, a reaction mixture was prepared by dissolving 6.81 g (0.05 mole) of p-anisaldehyde and 4.66 g (0.05 mole) of γ-picoline in 10.21 g (0.10 mole) of acetic anhydride and the mixture was heated under reflux for 16 hours to effect the reaction. After acetic acid and the unreacted acetic anhydride were evaporated from the reaction mixture, the residual reaction mixture was poured into water so that a crystalline material was precipitated therein. The reaction mixture was filtered and the collected precipitates were washed with water. Recrystallization of the precipitates from a mixture of methyl alcohol and water gave 5.80 g of 4-[2-(4-methoxyphenyl)ethenyl]pyridine, the yield of which was 55% of the theoretical value.

Then, 2.0 g of the thus obtained 4-[2-(4-methoxyphenyl)ethenyl]pyridine were dissolved in 10 ml of dimethylformamide and the solution was admixed with 1.30 g of 2-bromoethyl alcohol and heated at 100° C. for 1 hour to effect the reaction. After cooling to room temperature, 60 ml of acetone were added to the reaction mixture so that a crystalline material was precipitated therein. The reaction mixture was filtered and the collected precipitates were washed with acetone and dried to give 2.30 g of a product which could be identified to be the compound expressed by the formula (II-14). The yield of this product was 72% of the theoretical value.

The above described synthetic procedure was applicable in substantially the same manner excepting replacement of the reactant compounds to the preparation of each of the photo-bleachable compounds expressed by the formulas (II-5), (II-6), (II-9), (II-11), (II-12), (II-13), (II-15), (II-16), (II-17) and (II-18).

PREPARATION 5

4-[2-(2,4-Dimethoxyphenyl)ethenyl]pyridine was prepared in substantially the same manner as in Preparation 4 excepting replacement of p-anisaldehyde with 2,4-dimethoxy benzaldehyde and 2.41 g of this 4-[2-(2,4-dimethoxyphenyl)ethenyl]pyridine were dissolved in a mixture of 1.04 g of concentrated hydrochloric acid and 24.30 g of water. The thus obtained solution was a 10% by weight aqueous solution of the compound expressed by the formula (II-22).

An aqueous solution of the photo-bleachable compound expressed by the formula (II-46) was prepared in just the same manner as above excepting replacement of the reactant compounds.

PREPARATION 6

The photo-bleachable compound expressed by the structural formula (V-5) was prepared in the following manner. Thus, 10 g of 1,2-xylylene dibromide and 10.6 g of γ-picoline were dissolved in 80 ml of dimethylformamide and the solution was heated at 70° C. for 2 hours to effect the reaction. After cooling to room temperature, the reaction mixture was filtered and the collected precipitates were washed with acetone and dried to give 15.8 g of a crystalline product.

Then, 10 g of this crystalline material and 22 g of terephthaladehyde were dissolved in 50 ml of hot methyl alcohol and the solution was admixed with 0.95 g of piperidine and heated at 69° C. for 3 hours to effect the reaction. After the end of the above mentioned reaction time, the reaction mixture still at the hot condition was filtered to remove insoluble matters and 100 ml of acetone were added to the filtrate, which was kept standing overnight so that precipitates were formed therein. The precipitates were collected by filtration and washed with acetone followed by drying to give 10.6 g of a product which could be identified to be the compound expressed by the formula (V-5).

The above described synthetic procedure was applicable in substantially the same manner excepting replacement of the reactant compounds to the preparation of each of the photo-bleachable compounds expressed by the formulas (V-1), (V-2), (V-3), (V-4), (V-6), (V-7), (V-8), (V-9), (V-10) and (V-11).

PREPARATION 7

The photo-bleachable compound expressed by the structural formula (VI-1) was prepared in the following manner. Thus, sodium salt of 4-hydroxybenzaldehyde obtained from 4.88 g of 4-hydroxybenzaldehyde and 1.60 g of sodium hydroxide was dissolved in 15 ml of ethylene glycol monoethyl ether and the solution was admixed with 5.28 g of xylylene dibromide and heated at 120° C. for 2 hours to effect the reaction. After the end of the reaction time, the reaction mixture was filtered to remove the crystalline precipitates of sodium bromide and 100 ml of benzene were added to the filtrate which was washed successively with water, aqueous alkaline solution and water followed by evaporation of benzene to give 5.26 g of a dialdehyde compound.

Then, 1 g of the dialdehyde compound and 1.90 g of a quaternary salt of γ-picoline prepared from γ-picoline and dimethyl sulfate were dissolved in a solvent mixture of 8 ml of benzene and 4 ml of isopropyl alcohol and the solution was admixed with 0.25 g of piperidine and kept at 40° C. under agitation for 2 hours. Thereafter, the reaction mixture was filtered to collect the precipitates formed therein, and the pricipitates were purified by recrystallization from ethyl alcohol to give 0.64 g of a product which could be idetified to be the compound expressed by the formula (VI-1).

The photo-bleachable compound expressed by the structural formula (VI-3) was prepared in substantially the same manner as above excepting replacement of the reactant compounds.

PREPARATION 8

The photo-bleachable compound expressed by the structural formula (VI-2) was prepared in the following manner. Thus, 4.00 g of hydroxystilbazole prepared from 4-hydroxybenzaldehyde and 65-picoline and 2.06 g of benzene-1,2-diacetic acid dichloride were dissolved in 40 ml of dimethylformamide and the solution was cooled and admixed with 2.16 g of triethylamine followed by standing at 20° C. for 2 hours to effect the reaction. Thereafter, the reaction mixture was filtered to remove the precipitated triethylamine hydrochloride and 150 ml of dichloromethane were added to the filtrate followed by washing with water and then with an aqueous alkaline solution. Evaporation of the solvent gave 3.18 g of distilbazole.

A solution of 1.50 g of the distilbazole in 20 ml of dimethylacetamide was admixed with 1.1 g of dimethyl sulfate and the mixture was kept at room temperature under agitation for 4 hours so that a crystalline material was precipitated. The precipitates were collected by filtration and washed with acetone followed by drying to give 2.1 of a product which could be identified to be the compound expressed by the formula (VI-2).

PREPARATION 9

The photo-bleachable compound expressed by the structural formula (VII-1) was prepared in substantially the same manner as in Preparation 8 excepting replacement of dimethyl sulfate with 1,3-dibromopropane.

PREPARATION 10

The photo-bleachable compound expressed by the structural formula (VIII-1) was prepared in the following manner. Thus, potassium salt of 4-hydroxybenzaldehyde obtained from 6.1 g of 4-hydroxybenzaldehyde and 2.80 g of potassium hydroxide and 10.1 g of 1,3-dibromopropane were dissolved in 20 ml of dimethylformamide and the solution was heated at 70° to 80° C. for 2 hours to effect the reaction. The reaction mixture after completion of the reaction was admixed with water and extracted with ether. The ether solution taken by phase separation was washed with an aqueous alkali solution followed by evaporation of ether. Distillation of the residual mixture under reduced pressure gave 3.5 g of the monoether compound.

Then, 2.4 g of the monoether compound and 2.1 g of stilbazole prepared from 4-methoxybenzaldehyde and $\gamma$-picoline were dissolved in 20 ml of dimethylformamide and the solution was kept at 100° C. for 1.5 hours. After cooling, 150 ml of ethyl acetate were added to the reaction mixture to precipitate a crystalline material. Filtration of the reaction mixture gave 2.9 g of monostilbazolium.

Reaction of 1.36 g of the monostilbazolium and 0.66 g of a quaternary salt prepared from $\gamma$-picoline and dimethyl sulfate was performed in 15 ml of ethyl alcohol containing 0.005 g of piperidine as the catalyst at 60° C. for 3 hours. After completion of the reaction, the reaction mixture was filtered to collect the precipitates, which were washed with ethyl alcohol followed by drying to give 0.62 g of a product which could be identified to be the compound expressed by the formula (VIII-1).

The photo-bleachable compound expressed by the structural formula (VIII-2) was prepared in substantially the same manner as above excepting replacement of the reactant compounds correspondingly.

PREPARATION 11

The photo-bleachable compound expressed by the structural formula (IX-1) was prepared in the following manner. Thus, 6.31 g of dimethyl sulfate were added dropwise under cooling into a solution prepared by dissolving 4.66 g of $\gamma$-picoline in 25 ml of ethyl alcohol. After completion of the dropwise addition of the dimethyl sulfate, the mixture was further agitated at room temperature for additional 1 hour to complete the reaction for converting the $\gamma$-picoline into the form of a quaternary salt. The ethyl alcohol solution of the quaternary salt was then admixed with 4.19 g of terephthalaldehyde and 0.4 g of piperidine followed by heating under reflux for 3 hours. After cooling to room temperature, the reaction mixture was filtered to collect the precipitates. Recrystallization of the precipitates from a mixture of water and methyl alcohol gave 12.60 g of a crystalline product which could be identified to be the compound expressed by the formula (IX-1).

The photo-bleachable compound expressed by the structural formula (IX-2) was prepared in just the same manner as above excepting replacement of the reactant compouonds correspondingly.

EXAMPLE 1

A contrast-enhancing agent in the form of an aqueous solution was prepared by dissolving 2 g of poly(vinyl alcohol) having an average degree of polymerization of 500 and a degree of saponification of 88% and 1.2 g of the photo-bleachable compound of the structural formula (II-10) obtained in Preparation 1 described above in 25 ml of water. The surface of a glass substrate was coated with the solution and dried at 80° C. for 20 minutes to form a layer of the composition having a thickness of 0.46 $\mu$m.

The thus prepared layer of the contrast-enhancing agent on the glass substrate was exposed to ultraviolet of i-line having a wavelength of 365 nm for varied lengths of time. The % transmission of ultraviolet at a wavelength of 365 nm through the layer after exposure is shown by the solid line in FIG. 1 as a function of the exposure time in seconds.

EXAMPLE 2

An aqueous solution was prepared by dissolving 2 g of pullulan having an average molecular weight of about 200,000 and 1.2 g of the photo-bleachable compound expressed by the structural formula (II-43) in 25 ml of water and the solution was uniformly applied to the surface of a glass substrate followed by drying at 80° C. for 20 minutes. The thus obtained film had a thickness of 0.46 $\mu$m.

The broken line in FIG. 1 shows the photo-bleaching characteristics of this contrast-enhancing agent determined in the same manner as in Example 1.

EXAMPLE 3

An aqueous solution was prepared by dissolving 2 g of poly(vinyl pyrrolidone) having an average molecular weight of about 160,000 and 1.3 g of the photo-bleachable compound expressed by the structural formula (III-1) in 21.7 ml of water and the solution was uniformly applied to the surface of a glass substrate followed by drying to give a film of the composition having a thickness of 0.42 $\mu$m on the glass substrate.

Figure 2:
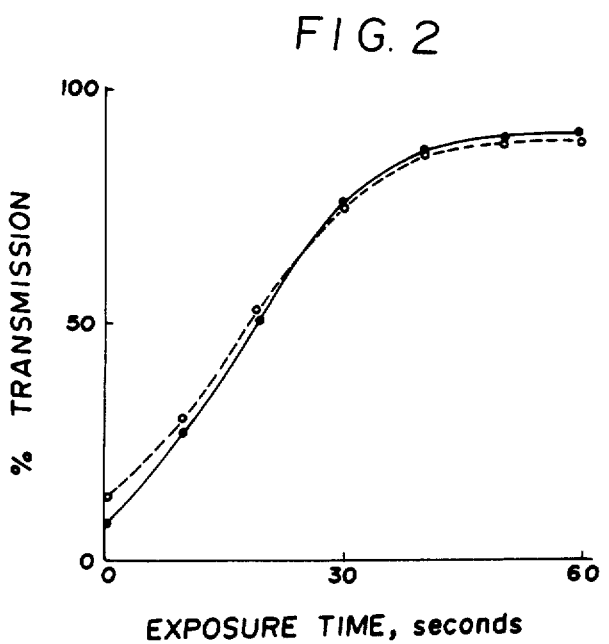

The solid line in FIG. 2 shows the photo-bleaching characteristics of this contrast-enhancing agent determined in the same manner as in Example 1.

EXAMPLE 4

An aqueous solution was prepared by dissolving 2 g of poly(vinyl alcohol) having an average degree of polymerization of about 500 and a degree of saponification of 88% and 1.2 g of the photo-bleachable compound expressed by the structural formula (II-31) in 21.5 ml of water and the solution was uniformly applied to the surface of a glass substrate followed by drying to give a film having a thickness of 0.45 $\mu$m on the glass substrate.

The broken line in FIG. 2 shows the photo-bleaching characteristics of this contrast-enhancing agent determined in the same manner as in Example 1.

EXAMPLE 5

An aqueous solution was prepared by dissolving 2 g of poly(vinyl alcohol) having an average degree of polymerization of about 500 and a degree of saponification of 88% and 1.5 g of the photo-bleachable compound expressed by the structural formula (II-47) in 30 ml of water and the solution was uniformly applied to the surface of a glass substrate followed by drying at 80° C. for 20 minutes to give a film having a thickness of 0.45 μm on the glass substrate.

Figure 3:
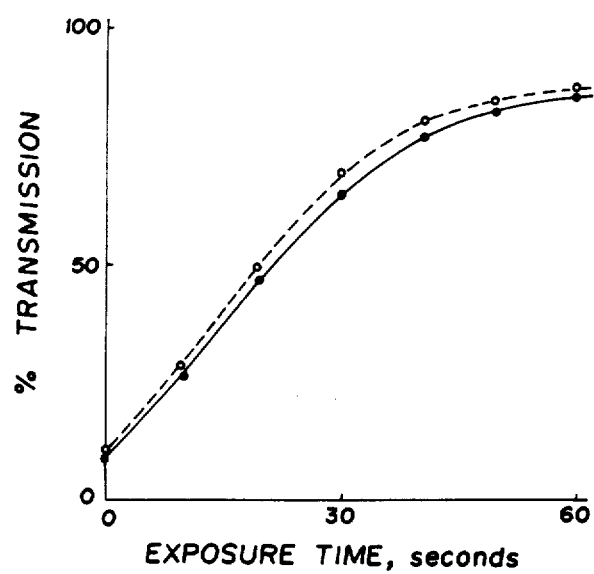

The solid line in FIG. 3 shows the photo-bleaching characteristics of this contrast-enhancing agent determined in the same manner as in Example 1 except that the light used for exposure and measurement of the transmission had a wavelength of 436 nm.

EXAMPLE 6

An aqueous solution was prepared by dissolving 0.4 g of poly(vinyl pyrrolidone) having an average molecular weight of about 160,000, 1.4 g of poly(vinyl alcohol) having an average degree of polymerization of 300 and a degree of saponification of 88% and 1.7 g of the photo-bleachable compound expressed by the structural formula (II-26) in 21.3 ml of water and the solution was uniformly applied to the surface of a glass substrate followed by drying to give a film having a thickness of 0.38 μm on the glass substrate.

The broken line in FIG. 3 shows the photo-bleaching characteristics of this contrast-enhancing agent determined in the same manner as in Example 5.

It is understood from FIGS. 1 to 3 that the contrast-enhancing agents of the invention exhibit good photo-bleaching characteristics.

EXAMPLE 7

A silicon wafer was coated with a positive-working photo-resist composition (OFPR-800, a product of Tokyo Ohka Kogyo Co.) in a thickness of 1.2 μm as dried followed by drying at 90° C. for 30 minutes.

Figure 4:
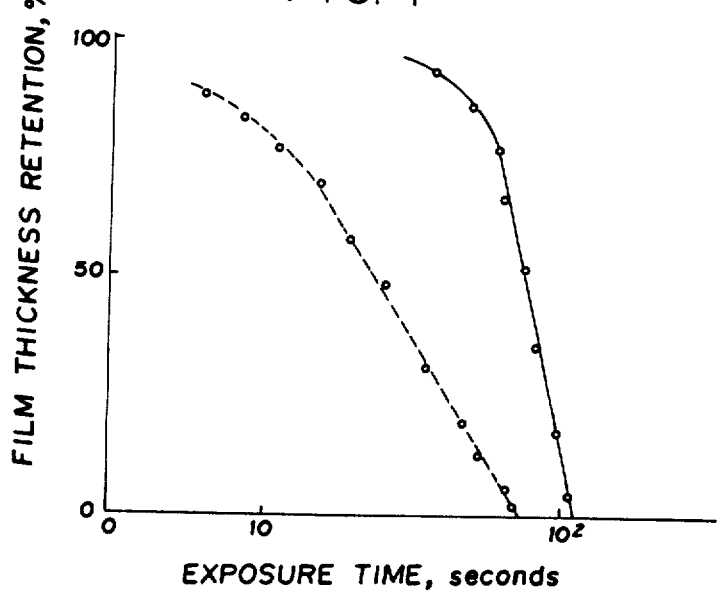
FIG. 4 illustrates the photosensitivity characteristic curves obtained in Example 7.

The photoresist layer was overcoated with the aqueous solution prepared in Example 6 in a thickness of 0.41 μm as dried followed by drying. The thus coated wafer was exposed to g-line light having a wavelength of 436 nm for varied lengths of exposure time and developed to determine the photo-sensitivity characteristics. The results are shown in FIG. 4 by the solid line and broken line for the experiments with and without the overcoating of the contrast-enhancing agent, respectively.

The results in this figure clearly show that the γ value could greatly be improved by using the contrast-enhancing agent of the present invention.

EXAMPLE 8

A silicon wafer was coated with the same positive-working photoresist composition and in the same manner as in Example 7 to give a photoresist layer having a thickness of 1.0 μm and overcoated with an aqueous solution prepared by dissolving 2 g of poly(vinyl alcohol) having an average degree of polymerization of 500 and a degree of saponification of 88% and 1.5 g of the compound of the formula (II-16) prepared in Preparation 4 in 30 ml of water to give an overcoating layer having a thickness of 0.45 μm as dried followed by drying.

The thus coated wafer was subjected to patternwise exposure to g-line light for a line-and-space pattern through a 5:1 wafer stepper (NA 0.35, a product of Nikon Co.) followed by development using a developer solution (NMD-3, a product of Tokyo Ohka Kogyo Co.). The results were that clear resolution was obtained of the line-and-space pattern of 0.8 μm width.

EXAMPLE 9

The experimental procedure was substantially the same as in Example 1 except that the coating solution was prepared by dissolving 2 g of the same poly(vinyl alcohol) and 1 g of the photo-bleachable compound of the formula (V-5) in place of the compound of the formula (II-10) in 40 ml of water. The thickness of the thus obtained film was 0.45 μm.

Figure 5:
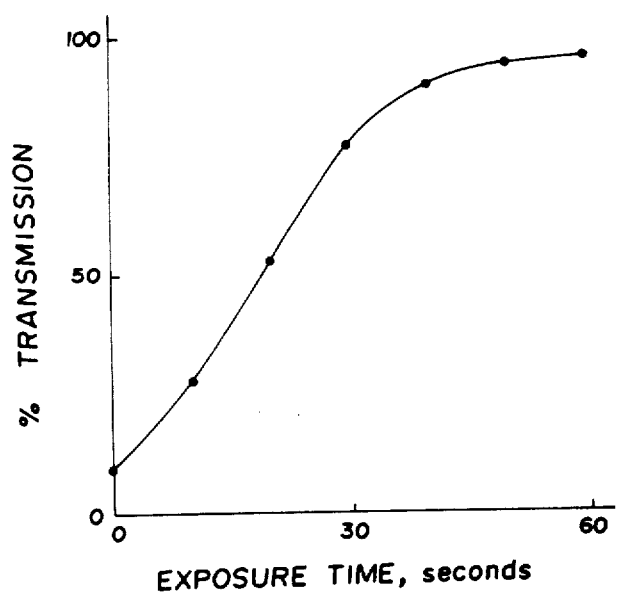
FIG. 5 is a graphic showing of the photo-bleaching characteristics of the contrast-enhancing agent prepared in Example 9.

The photo-bleaching characteristics of this coating layer are shown in FIG. 5.

EXAMPLE 10

The experimental procedure was substantially the same as in Example 6 except that the coating solution was prepared by dissolving 3 g of a poly(vinyl alcohol) having an average degree of polymerization of 1400 and a degree of saponification of 88% and 1 g of the photo-bleachable compound of the formula (VIII-2) in place of the compound of the formula (II-26) in 60 ml of water. The thickness of the thus obtained film was 0.57 μm.

Figure 6:
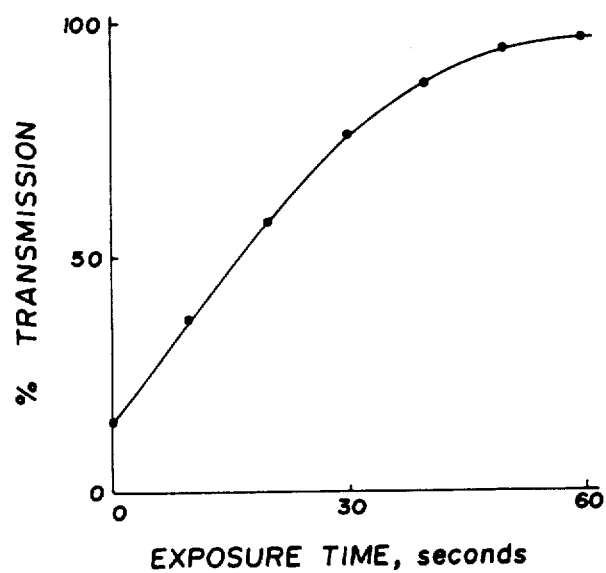
FIG. 6 illustrates a photosensitivity characteristic curve obtained in Example 10.

The photo-bleaching characteristics of this coating layer are shown in FIG. 6.

It is understood from FIGS. 5 and 6 that the contrast-enhancing agents of the present invention exhibit good photo-bleaching behavior.

EXAMPLE 11

A silicon wafer was coated with a positive-working photoresist composition (Microposit 1400-27, a product of Shipley Co.) followed by drying to form a photoresist layer having a thickness of 0.4 μm. The photoresist layer was overcoated with an aqueous solution prepared by dissolving 2 g of the compound expressed by the formula (V-4) and 4 g of pullulan in 80 ml of water followed by drying to form an overcoating layer having a thickness of 0.4 μm.

The thus coated wafer was subjected to patternwise exposure to i-line light for a line-and-space pattern through a 10:1 wafer stepper (NA 0.35, a product of Nikon Co.) followed by development using a developer solution (Microposit ME-312, a product of Shipley Co.). The results were that clear resolution was obtained of the line-and-apace pattern of 0.5 μm width.

What is claimed is:

1. A contranst-enhancing agent for a photoresist layer which comprises, in admixture:

(a) a photo-bleachable compound represented by the general formula

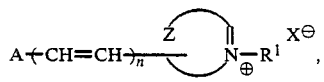

in which A is an aromatic group selected from the class consisting of an unsubstituted or substituted phenyl group of the general formula

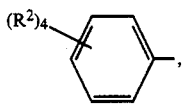

unsubstituted or substituted α- or β-napthyl group of the general formula

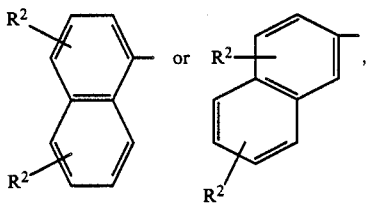

9-anthranyl group, unsubstituted or substituted furyl group of the general formula

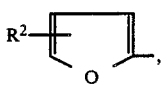

unsubstituted or substituted benzofuryl group of the general formula

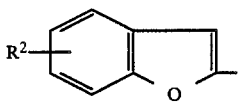

and unsubstituted or substituted thienyl group of the general formula

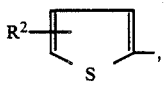

the subscript n is 1, 2 or 3, Z is a residue selected from the class consisting of pyridyl, quinolyl and benzothiazolyl groups forming a nitrogen-containing aromatic heterocyclic ring together with the nitrogen atom, X is an anionic group of monovalency and $R^1$ is a hydrogen atom or a group selected from the class consisting of alkyl, alkenyl and aralkyl groups, $R^2$ being an atom of hydrogen or a halogen or a group selected from the class consisting of alkyl, hydroxy, alkoxy, formyl and acyl groups; and (b) a water-soluble polymer selected from the class consisting of poly(vinyl alcohol), poly(vinyl pyrrolidone) and pullulan.

2. The contrast-enhancing agent as claimed in claim 1 wherein the amount of the water-soluble polymer as component (b) is in the range from 0.5 to 10 parts by weight per part by weight of the photo-bleachable compound as the component (a).

3. The contrast-enhancing agent as claimed in claim 1 wherein the subscript n is 1 or 2.

4. The contrast-enhancing agent as claimed in claim 1 wherein the nitrogen-containing aromatic heterocyclic ring is a pyridyl group or a quinolyl group.

5. The contrast-enhancing agent as claimed in claim 1 wherein the photo-bleachable compound is a compound represented by either one of the general formulas

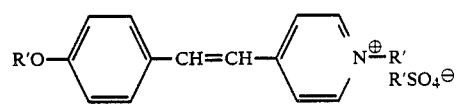

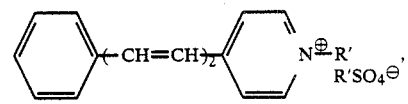

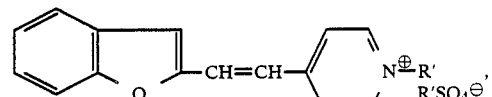

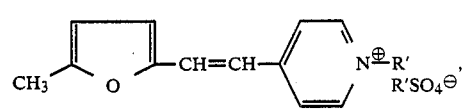

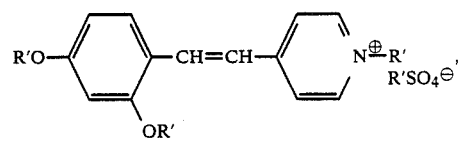

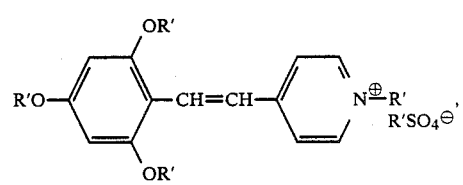

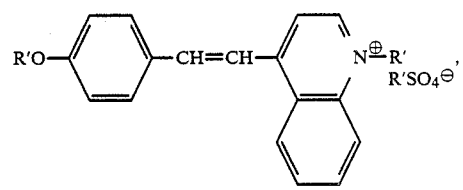

and

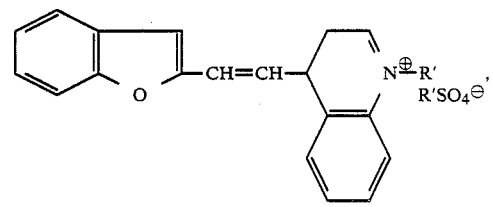

in which each $R^1$ is, independently from the others, an alkyl group selected from the class consisting of methyl, ethyl and propyl groups.

6. A method for enhancing the contrast of an image of a photoresist layer on a substrate surface which comprises, prior to exposure of the photoresist layer to light, the step of coating the surface of the photoresist layer with a contrast-enhancing agent comprising, in admixture, (a) a photo-bleachable compound represented by the general formula

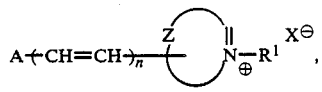

in which A is an aromatic group selected from the class consisting of an unsubstituted or substituted phenyl group of the general formula

unsubstituted or substituted α- or β-naphthyl group of the general formula substituted α- or β-naphthyl group of the general formula

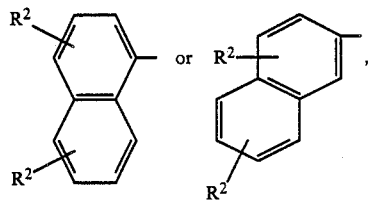

9-anthranyl group, unsubstituted or substituted furyl group of the general formula

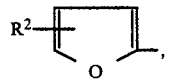

unsubstituted or substituted benzofuryl group of the general formula

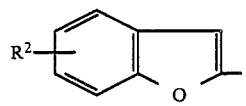

and unsubstituted or substituted thienyl group of the general formula

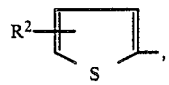

the subscript n is 1, 2 or 3, Z is a residue selected from the class consisting of pyridyl, quinolyl and benzothiazolyl groups forming a nitrogen-containing aromatic heterocyclic ring together with the nitrogen atom, X is an anionic group of monovalency and $R^1$ is a hydrogen atom or a group selected from the class consisting of alkyl, alkenyl and aralkyl groups, $R^2$ being an atom of hydrogen or a halogen or a group selected from the class consisting of alkyl, hydroxy, alkoxy, formyl and acyl groups; and (b) a water-soluble polymer selected from the class consisting of poly(vinyl alcohol), poly(vinyl pyrrolidone) and pullulan, to form a contrast-enhancing layer thereon.

7. The method for enhancing the contrast of an image of a photoresist layer on a substrate surface as claimed in claim 6 wherein the contrast-enhancing agent is applied to the substrate surface as a solution in water as the solvent.

* * * * *

UNITED STATES PATENT AND TRADEMARK OFFICE
CERTIFICATE OF CORRECTION

PATENT NO. : 4,925,770

DATED : May 15, 1990

INVENTOR(S) : Kunihiro Ichimura

Page 1 of 4

It is certified that error appears in the above-identified patent and that said Letters Patent is hereby corrected as shown below:

Insert Figures 1-6 as Part of letters patent as shown on the attached sheets.

On the Title page, "No Drawings" should read --3 Drawing Sheets--.

Signed and Sealed this

First Day of September, 1992

Attest:

DOUGLAS B. COMER

*Attesting Officer*  *Acting Commissioner of Patents and Trademarks*